(12) United States Patent
Schroeder et al.

(10) Patent No.: US 8,344,438 B2
(45) Date of Patent: Jan. 1, 2013

(54) ELECTRODE OF AN INTEGRATED CIRCUIT

(75) Inventors: Uwe Schroeder, Dresden (DE); Stefan Jakschik, Dresden (DE); Johannes Heitmann, Dresden (DE); Tim Boescke, Dresden (DE); Annette Saenger, Dresden (DE)

(73) Assignee: Qimonda AG, München (DE)

( * ) Notice: Subject to any disclaimer, the term of this patent is extended or adjusted under 35 U.S.C. 154(b) by 546 days.

(21) Appl. No.: 12/023,321

(22) Filed: Jan. 31, 2008

(65) Prior Publication Data

US 2009/0194410 A1    Aug. 6, 2009

(51) Int. Cl.
*H01L 27/108*    (2006.01)
*H01L 29/94*    (2006.01)
*H01L 23/48*    (2006.01)
*H01L 23/52*    (2006.01)
*H01L 29/40*    (2006.01)

(52) U.S. Cl. ........ 257/306; 257/758; 257/762; 257/764; 257/768; 257/769; 257/E29.343

(58) Field of Classification Search .............. 257/758, 257/762, 764, 768, 769, E29.343, 303, 306
See application file for complete search history.

(56) References Cited

U.S. PATENT DOCUMENTS

| | | | | |
|---|---|---|---|---|
| 5,005,102 A * | 4/1991 | Larson | | 361/313 |
| 5,262,920 A * | 11/1993 | Sakuma et al. | | 361/321.5 |
| 5,520,992 A * | 5/1996 | Douglas et al. | | 428/209 |
| 5,612,574 A * | 3/1997 | Summerfelt et al. | | 257/783 |
| 5,790,366 A * | 8/1998 | Desu et al. | | 361/305 |
| 6,291,889 B1 * | 9/2001 | Koh et al. | | 257/763 |
| 6,525,358 B2 * | 2/2003 | Harris et al. | | 257/295 |
| 6,617,634 B2 * | 9/2003 | Marsh et al. | | 257/300 |
| 6,670,233 B2 * | 12/2003 | Athavale et al. | | 438/243 |
| 7,026,680 B2 * | 4/2006 | Baniecki et al. | | 257/310 |
| 2002/0086164 A1 * | 7/2002 | Anzaki et al. | | 428/432 |
| 2002/0184939 A1 * | 12/2002 | Yadav et al. | | 73/24.04 |
| 2004/0070017 A1 * | 4/2004 | Yang et al. | | 257/296 |
| 2004/0090500 A1 * | 5/2004 | Murai | | 347/70 |
| 2004/0101709 A1 * | 5/2004 | Chen | | 428/626 |
| 2004/0166672 A1 * | 8/2004 | Reinberg | | 438/686 |
| 2004/0173823 A1 * | 9/2004 | Murai | | 257/252 |
| 2004/0179259 A1 * | 9/2004 | Fujii et al. | | 359/297 |
| 2005/0101085 A1 * | 5/2005 | Ito et al. | | 438/244 |
| 2005/0145916 A1 * | 7/2005 | Park et al. | | 257/303 |
| 2005/0145970 A1 * | 7/2005 | Lu et al. | | 257/449 |
| 2005/0157544 A1 * | 7/2005 | Min et al. | | 365/171 |
| 2005/0260823 A9 * | 11/2005 | Uhlenbrock et al. | | 438/396 |
| 2006/0124983 A1 * | 6/2006 | Kutsunai et al. | | 257/306 |
| 2007/0059502 A1 * | 3/2007 | Wang et al. | | 428/209 |
| 2007/0097651 A1 * | 5/2007 | Canale et al. | | 361/704 |
| 2007/0263340 A1 * | 11/2007 | Marsh | | 361/311 |

* cited by examiner

*Primary Examiner* — Teresa M Arroyo

(74) *Attorney, Agent, or Firm* — Murphy, Bilak & Homiller, PLLC

(57) ABSTRACT

The present invention refers to an electrode comprising a first metallic layer and a compound comprising at least one of a nitride, oxide, and oxynitride of a second metallic material.

14 Claims, 1 Drawing Sheet

ELECTRODE OF AN INTEGRATED CIRCUIT

BACKGROUND OF THE INVENTION

1. Field of the Invention

The present invention generally relates to an electrode of an integrated circuit.

2. Description of the Related Art

Although in principle applicable to arbitrary integrated semiconductor structures, the following technology and the underlying problems will be explained with respect to a capacitor electrode.

In recent years, lateral dimensions of electric capacitors have been reduced steadily. Electric capacity of the capacitors is maintained by increasing the vertical extension. Further, high-k dielectric materials are used as capacitor dielectrics.

A further important property of electric capacitors is the retention time of an electric charge in the electric capacitor. The retention time is limited by leakage currents between the electrodes or into the dielectric material. Due to the short distance between the electrodes and the medium isolation properties of high-k dielectric materials, like barium strontium titanate (BST), hafnium oxide etc., leakage currents are becoming an important issue.

SUMMARY

According to an aspect of the technology, an electrode of an integrated circuit comprises: at least one metallic layer comprising a first metallic material selected of at least one of ruthenium, ruthenium oxide, iridium, iridium oxide, platinum, palladium, gold, silver, rhenium, and rhodium and a metal compound selected of a nitride, an oxide, and an oxynitride of a second metallic material. The second compound is embedded by the at least one metallic layer.

According to a further aspect of the technology an electrode of an integrated circuit comprises a multilayer stack of at least two first layers and at least one second layer, which are arranged alternatingly. The first layers comprise of at least one of ruthenium, ruthenium oxide, iridium, iridium oxide, platinum, palladium, gold, silver, rhenium, and rhodium. The second layer comprises a compound selected of a nitride, an oxide, and an oxynitride of a second metallic material selected of the group of the second the fourth, the fifth, and the sixth group of the periodic table.

According to a further aspect of the technology an electrode of an integrated circuit comprises at least one metallic layer comprising a first metallic material selected of at least one of ruthenium, ruthenium oxide, iridium, iridium oxide, platinum, palladium, gold, silver, rhenium, and rhodium and a metal compound selected of a nitride, an oxide, and an oxynitride of a second metallic material selected of the group of the second, the fourth, the fifth, and the sixth group of the periodic table. The metal compound is arranged as implant in the at least one metallic layer.

According to a further aspect an electrode of an integrated circuit comprises at least one metal oxide layer comprising an oxide of a first metallic material selected of at least one of ruthenium, iridium, rhenium, and rhodium and a metal compound selected of a nitride, an oxide, and an oxynitride of a second metallic material. The second compound is embedded by the at least one metallic layer.

BRIEF DESCRIPTION OF THE DRAWINGS

In the following description, reference is made to the accompanying drawings that form part hereof, and in which is shown by way of illustration one or more specific implementations in which the invention may be practiced. It is to be understood that other implementations may be utilized and structural changes may be made without departing from the scope of this invention.

DETAILED DESCRIPTION

Figure 1:
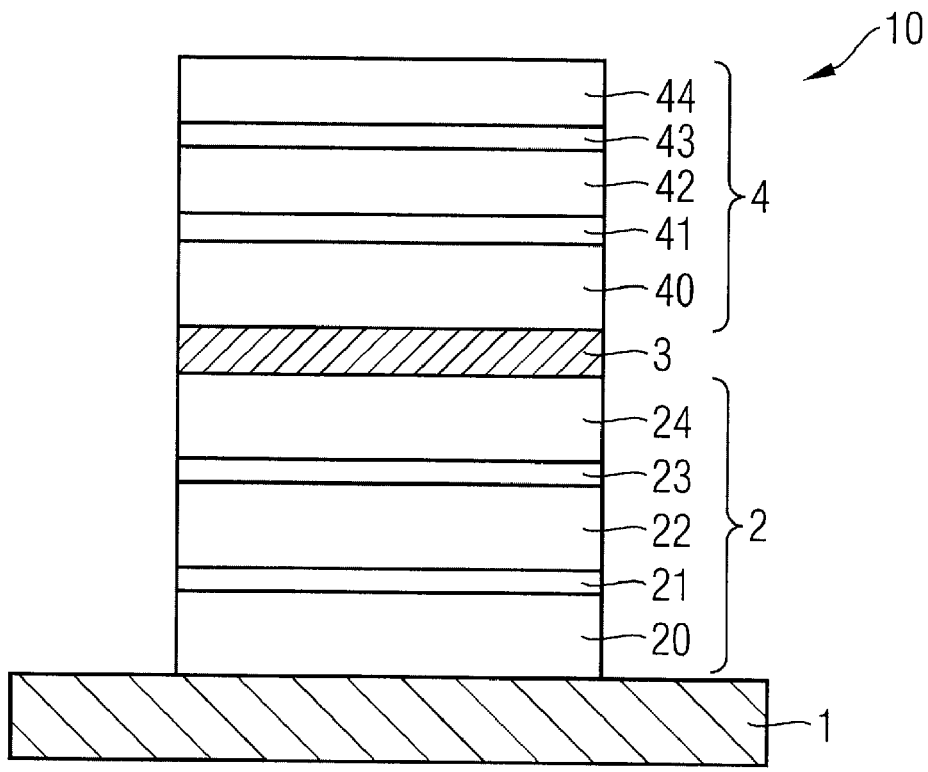
FIG. 1 shows an approach of a capacitor structure

The invention can be better understood by referring to the following figures. The components in the figures are not necessarily to scale, emphasis instead being placed upon illustrating the principles of the invention. In the figures, like reference numerals designate corresponding parts throughout the different views.

It is to be understood and appreciated that the process steps and structures described below do not form a complete process flow for the manufacture of integrated circuits. The present technology can be practiced in conjunction with integrated circuit fabrication techniques that are currently used in the art, and only so much of the commonly practiced process steps are included herein as are necessary to provide an understanding of the present technology.

FIG. 1 shows a cross-section of an approach of a capacitor structure 10. On a supporting substrate 1, a stack of a first electrode 2, a dielectric layer 3 and a second electrode 4 is arranged.

The dielectric layer 3 can be chosen of high-k dielectric materials of the state of the art. These dielectric materials can comprise strontium titanate, barium strontium titanate, hafnium oxide, zirconium oxide, etc.

The electrodes 2, 4 may have a high specific conductivity to provide a low resistance. The resistance limits the current flow to the electric capacitor and thus limits the read out time and storing time of the electric capacitor 10.

The first electrode 2 is made of several distinct layers. A first layer 20 consists of or comprises ruthenium. A second layer 21 is deposited on the first layer 20. The second layer 21 consists of or comprises titanium nitride. A third layer 22 is deposited on the second layer 22. The third layer 22 again consists of or comprises ruthenium.

Ruthenium can provide a high specific conductivity. A low resistivity and short delay times of the electric capacitor 10 may be achieved.

The electric work function of ruthenium may be increased by the intermediately arranged second layer 21 comprising titanium nitride. A high electric work function may be beneficial for reducing the leakage current from the electrode 2 into the dielectric layer 3.

The interaction of ruthenium and titanium nitride for achieving a high electric work function may be enhanced by using thin first, second, and third layers 20, 21, 22.

The second layer 21 has a thickness of about 1 to 10 atomic layers, at most 5 atomic layers, at most 2 atomic layers. The first and the third layers 20, 22 have a thickness of about 1 to 20 atomic layers, at most 10 atomic layers, at most 5 atomic layers.

The first and third layer of ruthenium 20, 22 may be deposited by an atomic layer deposition technique or a chemical vapour deposition technique. The second layer 21 of titanium is deposited by an atomic layer deposition technique or chemical vapour deposition technique, thus, its thickness may be controlled on atomic scale. Alternatively, titanium may be deposited and transformed to titanium nitride by a subsequent thermal process in an ammonia atmosphere or plasma of nitrogen or ammonia.

On the above stack of three layers 20, 21, 22 further layers 23, 24 can be deposited. Preferably, the further layers comprise ruthenium and titanium nitride in an alternating fashion.

The second electrode 4 may be formed equal or similar to the first electrode 2. The second electrode 4 comprises a stack of layers 40, 41, 42, 43, 44 comprising or made of ruthenium 40, 42, 44 and titanium nitride 41, 43, respectively.

Figure 2:
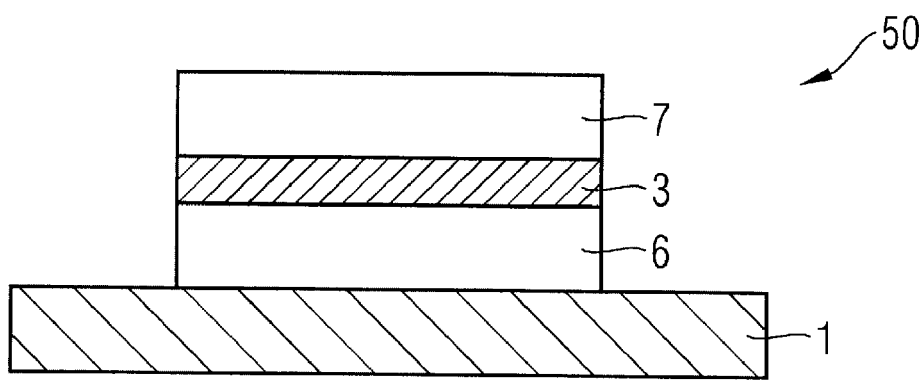
FIG. 2 shows a further approach of a capacitor structure

FIG. 2 illustrates a further approach of a capacitor. The capacitor 50 comprises a first electrode 6, a dielectric layer 3, and a second electrode 7.

The first electrode 6 comprises or is made of ruthenium and titanium nitride. The atomic ratio of ruthenium and titanium is in the range of 0.5 to 30, for example at least 1, at least 3, at the most 10, at the most 3, about 3.

In this approach ruthenium and titanium nitride are forming an alloy. The electrode 6 comprises or is made of this alloy. Most of the titanium nitride is enclosed or embedded in ruthenium. Ruthenium may not form a nitride in the alloy, but the nitrogen is chemically bound to titanium.

The second electrode 7 is formed of the same alloy as the first electrode 6.

The first electrode 7 is deposited using a chemical vapour deposition technique; alternatively an atomic layer deposition technique may be employed.

An exemplary deposition technique is described on basis of an atomic layer deposition technique. A first precursor transporting ruthenium may be introduced into a reaction chamber. A single pulse of the first precursor and removal of the hydrocarbon-group of the first precursor does not provide a full monolayer of ruthenium. This is basically due to the larger diameter of the hydrocarbon-group compared to the lattice distance in ruthenium. Thus, two ruthenium atoms are most likely not deposited on neighbouring lattice points using a single pulse. Titanium nitride molecules can be deposited by a second pulse at the interstitials in the ruthenium lattice. The number of subsequent pulses providing ruthenium is predetermined, thus defining the number of complete monolayers made of ruthenium. Periodically a monolayer of ruthenium is deposited partially, only. The interstitials are filled with titanium nitride. The process continues to deposit complete monolayers of ruthenium. Thus, an electrode is formed which has no complete monolayer of titanium nitride. Nevertheless, the titanium nitride is homogenously distributed in the electrode.

Another deposition method introduces in parallel the first and second precursors into the reaction chamber. The deposition ratio is controlled by the flux of the two precursors.

The layers 21, 23 and electrodes 6, 7 comprising titanium nitride may be doped with silicon, germanium, carbon, and tin.

An alternative approach uses iridium instead of ruthenium. It is referred to the above approach having ruthenium replaced by iridium.

An alternative approach uses titanium oxynitride instead of titanium nitride. It is referred to the above approach having titanium nitride replaced by titanium oxynitride.

The formation of the oxides or oxynitrides may comprise a thermal oxidation, a remote plasma treatment, a direct plasma treatment or exposition to ozone or other oxidizing gases/plasmas.

The deposition of metals can be performed by electro plating, too.

Other materials suitable as substitute for ruthenium enclose gold, silver, rhenium, platinum, palladium, rhodium and oxides of ruthenium, iridium, rhenium, and rhodium.

Other materials suitable as substitute for titanium nitride enclose tantalum nitride, tantalum oxynitride, tungsten nitride, tungsten oxynitride, molybdenum nitride, molybdenum oxynitride, vanadium nitride, vanadium oxynitride, niobium nitride, niobium oxynitride, nickel oxynitride, strontium oxide, strontium oxynitride, barium oxide, barium oxynitride, cobalt oxynitride. Alternatively, tin oxide, zinc oxide may be used.

The capacitor can be formed as stack capacitor or deep trench capacitor.

Other systems, methods features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

What is claimed is:

1. An electrode of an integrated circuit, comprising:
   a first metallic layer comprising a first metallic material selected of at least one of ruthenium, ruthenium oxide, iridium, iridium oxide, platinum, palladium, gold, silver, rhenium, and rhodium;
   an electrically conductive metal compound layer deposited on the first metallic layer, the electrically conductive metal compound layer selected from an electrically conductive nitride of a second metallic material, an electrically conductive oxide of a second metallic material, and an electrically conductive oxynitride of a second metallic material;
   a second metallic layer comprising the first metallic material deposited on the electrically conductive metal compound layer, so that a path of low resistance is provided from the first metallic layer to the second metallic layer through the metal compound layer;
   a second electrically conductive metal compound layer deposited on the second metallic layer, the electrically conductive metal compound layer selected from an electrically conductive nitride of the second metallic material, an electrically conductive oxide of the second metallic material, and an electrically conductive oxynitride of the second metallic material; and
   a third metallic layer comprising the first metallic material deposited on the second electrically conductive metal compound layer.

2. The electrode according to claim 1, wherein the second metallic material is selected of the group of the second, the fourth, the fifth, and the sixth, group of the periodic table.

3. The electrode according to claim 1, wherein at least one of the first and second electrically conductive metal compound layer is arranged adjacent to two of the metallic layers.

4. The electrode according to claim 2, wherein one of the first and second metallic layers has a thickness of 1 to 50 atomic layers.

5. The electrode according to claim 2, wherein the electrically conductive metal compound layer has a thickness of 1 to 50 atomic layers.

6. The electrode according to claim 2, wherein a dopant is provided in the metal compound layer, the dopant comprises at least one of silicon, germanium, carbon, and tin.

7. The electrode according to claim 2, wherein the atomic ratio of the first metallic material and the second metallic material is in the range of 0.5 to 30.

8. The electrode according to claim 2, wherein the atomic ratio of the first metallic material and the second metallic material is in the range of 0.5 to 30.

9. The electrode according to claim 2, wherein a dopant is provided in the metal compound, the dopant is selected of at least one of silicon, carbon, germanium, and tin.

10. An electrode of an integrated circuit, comprising:
an electrically conductive multilayer stack of at least two first layers and at least one second layer, which are arranged alternatingly, so that a path of low resistance is provided through the at least two first layers and the at least one second layer of the multilayer stack;
the at least two first layers comprising at least one of ruthenium, ruthenium oxide, iridium, iridium oxide, platinum, palladium, gold, silver, rhenium, and rhodium, and the at least one second layer comprising a metal compound layer comprising a second metallic metal and at least one of a nitride, an oxide, and an oxynitride, wherein the second metallic material is selected of the group of the second, the fourth, the fifth, and the sixth group of the periodic table; and
wherein at least one of the two first layers has a thickness in the range of 1 to 50 atomic layers and the at least one second layer has a thickness in the range of 1 to 50 atomic layers.

11. The electrode according to claim 10, wherein the at least two first layers and the at least one second layer are arranged adjacently.

12. The electrode according to claim 10, wherein the at least two first layers consist of the at least one of ruthenium and iridium.

13. An electrode of an integrated circuit, comprising:
at least one metallic layer comprising a first metallic material selected of at least one of ruthenium, ruthenium oxide, iridium, iridium oxide, platinum, palladium, gold, silver, rhenium, and rhodium;
a metal compound layer comprising a second metallic material and at least one of a nitride, an oxide, and an oxynitride, the second metallic material selected of the group of the fourth, the fifth, the sixth, and the tenth group of the periodic table; and
the metal compound layer being arranged at interstitials of the at least one metallic layer, the metal compound layer having a thickness in the range of 1 to 50 atomic layers.

14. A multi-layer electrode arrangement comprising:
a first metallic layer comprising an oxide of a first metallic material including at least one of ruthenium, iridium, rhenium, and rhodium;
a first electrically conductive metal compound layer deposited on the first metallic layer, the first electrically conductive metal compound layer comprising a second metallic material and at least one of a nitride, an oxide, and an oxynitride;
a second metallic layer comprising the first metallic material deposited on the first electrically conductive metal compound layer;
a third metallic layer comprising the oxide of the first metallic material;
a second electrically conductive metal compound layer deposited on the third metallic layer, the second electrically metal compound layer comprising the second metallic material;
a fourth metallic layer comprising the first metallic material deposited on the second electrically conductive metal compound layer; and
a dielectric layer disposed between the second metallic layer and the third metallic layer.

* * * * *